(12) United States Patent
Naito et al.

(10) Patent No.: US 10,332,905 B2
(45) Date of Patent: Jun. 25, 2019

(54) SEMICONDUCTOR MEMORY DEVICE (71) Applicant: Toshiba Memory Corporation, Minato-ku (JP)

(72) Inventors: Shinya Naito, Toyota (JP); Osamu Fujii, Yokkaichi (JP); Takayuki Kakegawa, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 119 days.

(21) Appl. No.: 15/460,551

(22) Filed: Mar. 16, 2017

(65) Prior Publication Data

US 2018/0083102 A1 Mar. 22, 2018

Related U.S. Application Data

(60) Provisional application No. 62/395,739, filed on Sep. 16, 2016.

(51) Int. Cl.
*H01L 27/11582* (2017.01)
*H01L 27/1157* (2017.01)

(52) U.S. Cl.
CPC .... *H01L 27/11582* (2013.01); *H01L 27/1157* (2013.01)

(58) Field of Classification Search
CPC ........... H01L 27/11582; H01L 27/1157; H01L 27/11556; H01L 27/11524
See application file for complete search history.

(56) References Cited

U.S. PATENT DOCUMENTS

| 9,287,290 | B1 * | 3/2016 | Rabkin | ............ H01L 27/11556 |
| 2010/0013049 | A1 | 1/2010 | Tanaka et al. | |
| 2013/0341701 | A1 | 12/2013 | Blomme et al. | |
| 2017/0243651 | A1 * | 8/2017 | Choi | ................ G11C 16/0483 |
| 2017/0271261 | A1 * | 9/2017 | Tsutsumi | .......... H01L 27/11565 |

FOREIGN PATENT DOCUMENTS

| JP | 2009-146942 A | 7/2009 |
| JP | 2010-27870 A | 2/2010 |
| JP | 2013-543266 A | 11/2013 |

* cited by examiner

*Primary Examiner* — Marcos D. Pizarro
*Assistant Examiner* — Antonio B Crite
(74) *Attorney, Agent, or Firm* — Oblon, McClelland, Maier & Neustadt, L.L.P.

(57) ABSTRACT

A semiconductor memory device includes a conductive layer; a plurality of electrode layers stacked on the conductive layer; a semiconductor pillar extending through the electrode layers in a stacking direction and electrically connected to the conductive layer; and an insulating layer positioned between the semiconductor pillar and the electrode layers and extending along the semiconductor pillar. The semiconductor pillar has a channel portion extending through the electrode layers and a high impurity concentration portion positioned at a bottom end on a side of the conductive layer. The high impurity concentration portion includes an impurity of a higher concentration than an impurity concentration in the channel portion. The insulating layer has an end portion extending toward a center of the bottom end of the semiconductor pillar, and a boundary of the channel portion and the high impurity concentration portion is positioned above the end portion of the insulating layer.

14 Claims, 11 Drawing Sheets

SEMICONDUCTOR MEMORY DEVICE

CROSS-REFERENCE TO RELATED APPLICATIONS

This application is based upon and claims the benefit of priority from U.S. Provisional Patent Application 62/395,739 filed on Sep. 16, 2016; the entire contents of which are incorporated herein by reference.

FIELD

Embodiments are generally related to a semiconductor memory device.

BACKGROUND

A semiconductor memory device is under developing, which includes three-dimensionally arranged memory cells. For example, a NAND type memory device includes a plurality of word lines stacked on a conductive layer and a semiconductor channel body extending through the word lines in the stacking direction, and memory cell transistors are disposed at portions respectively, where the semiconductor channel body intersects the word lines. Each memory cell transistor is operated by a voltage applied between each of the word lines and the semiconductor channel body which is electrically connected to the conductive layer. In such a device, there may be a case where ON-current for reading data out from a memory cell is lowered depending on a connecting structure between the conductive layer and the semiconductor channel body.

DETAILED DESCRIPTION

According to one embodiment, a semiconductor memory device includes a conductive layer; a plurality of electrode layers stacked on the conductive layer; a semiconductor pillar extending through the plurality of electrode layers in a stacking direction and electrically connected to the conductive layer; and an insulating layer positioned between the semiconductor pillar and the plurality of electrode layers. The insulating layer extends along the semiconductor pillar in the stacking direction. The semiconductor pillar has a channel portion extending through the plurality of electrode layers and a high impurity concentration portion positioned at a bottom end on the conductive layer side. The high impurity concentration portion includes an impurity of a higher concentration than an impurity concentration in the channel portion. The insulating layer has an end portion extending toward a center of the bottom end of the semiconductor pillar, and a boundary of the channel portion and the high impurity concentration portion is positioned above the end portion of the insulating layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

Figure 1:
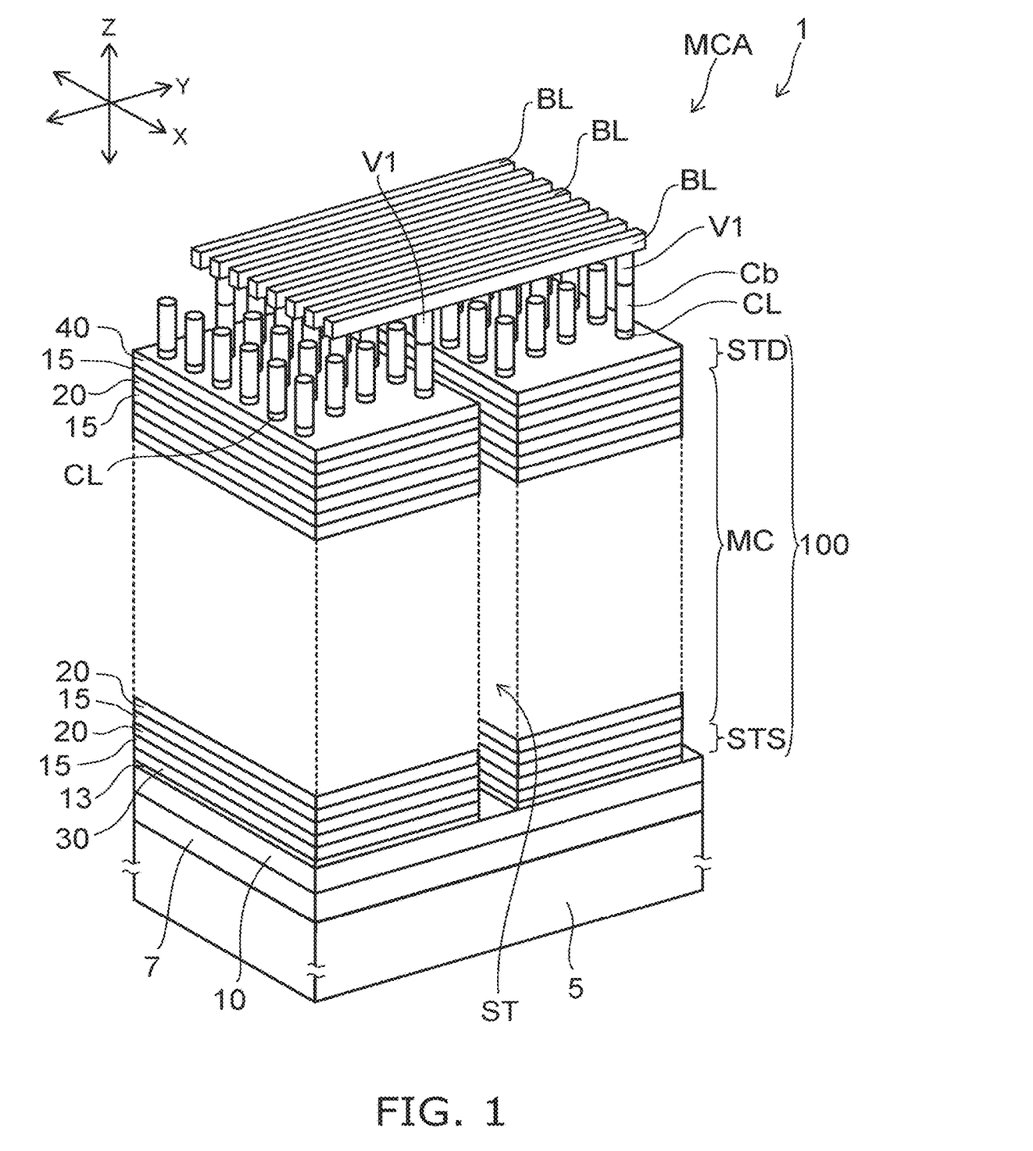
FIG. 1 is a perspective view schematically showing a semiconductor memory device according to a first embodiment.
Figure 2:
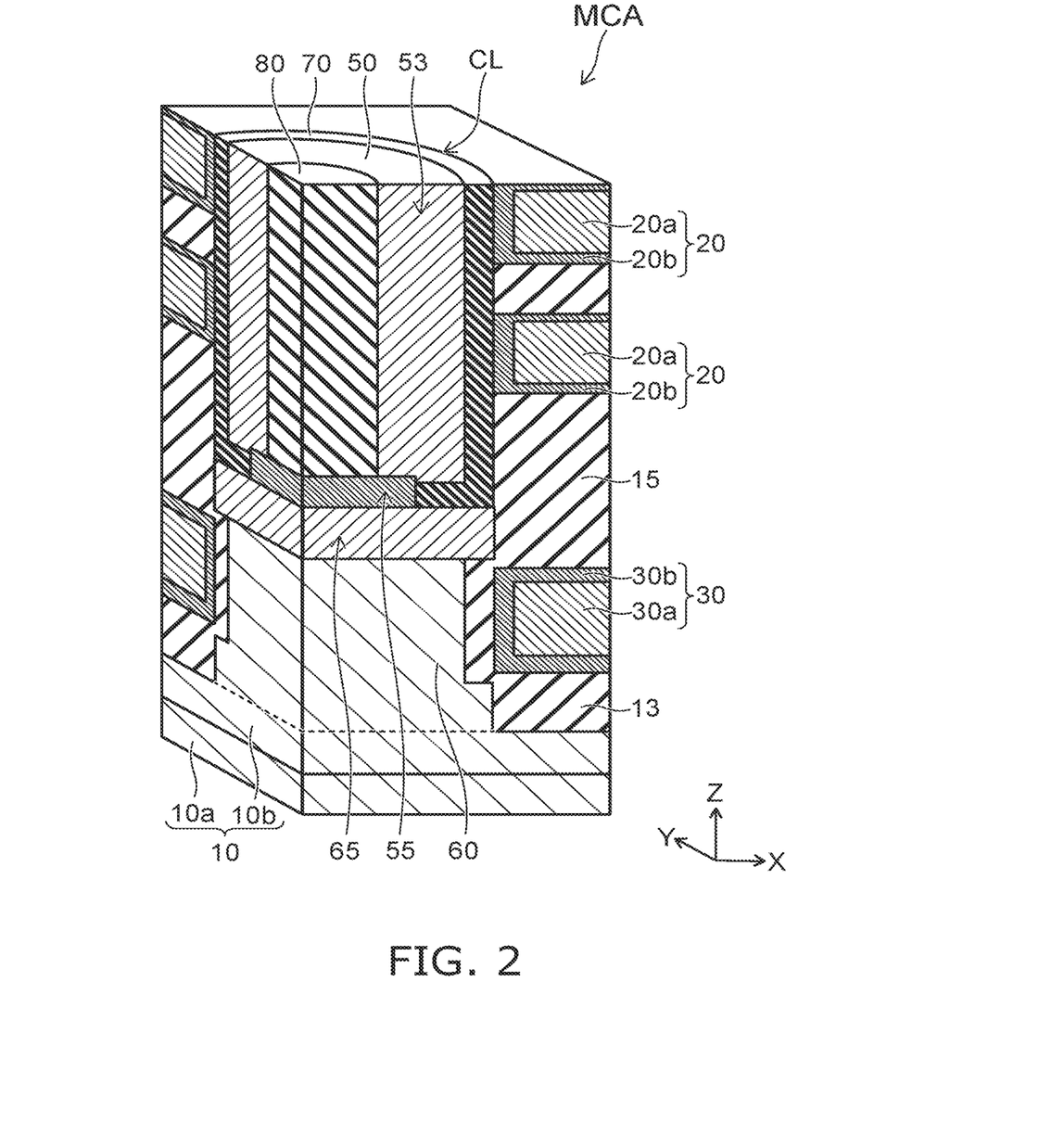
FIG. 2 is a perspective view schematically showing a cross section of the semiconductor memory device according to the first embodiment.

FIGS. 1 and 2 are perspective views schematically showing a semiconductor memory device 1 according to a first embodiment. The semiconductor memory device 1 is, for example, a NAND type memory device and includes three-dimensionally arranged memory cells. FIG. 1 is a perspective view showing a memory cell array MCA of the semiconductor memory device 1. FIG. 2 is a perspective view showing partial cross sections parallel to the X-Z plane and the Y-Z plane of the memory cell array MCA.

As shown in FIG. 1, the semiconductor memory device 1 includes a conductive layer (hereinafter referred to as a source layer 10), which is provided on a substrate 5, and a stacked body 100. The source layer 10 is provided on the substrate 5 with the interlayer insulating layer 7 interposed.

The stacked body 100 includes a plurality of electrode layers stacked in the Z-direction (hereinafter referred to as word lines 20, selection gates 30 and 40). A plurality of stacked bodies are arranged, for example, in the Y-direction on the source layer 10. The stacked bodies 100 being adjacent in the Y-direction are separated by a slit space ST.

The selection gate 30 is provided on the source layer 10 with the insulating layer 13 interposed. The word lines 20 are stacked on the selection gate 30. The insulating layers 15 are provided between the selection gate 30 and the lowermost word line 20 and between the adjacent word lines 20 in the Z direction. The selection gate 40 is provided on the uppermost word line 20 with other insulating layer 15 interposed.

The substrate 5 is a silicon substrate, for example. The source layer 10 includes, for example, a polycrystalline silicon layer or a metal layer, or both, and is provided in a plate shape extending in the X-direction and the Y-direction.

The word line 20 and the selection gates 30 and 40 are, for example, low resistance polycrystalline silicon layers. The interlayer insulating layer 7 and the insulating layers 13 and 15 are, for example, silicon oxide layers. The semiconductor memory device 1 may include a circuit for driving the memory cells MC between the substrate 5 and the interlayer insulating layer 7.

The stacked body 100 includes a plurality of columnar bodies CL extending in the Z direction through the word lines 20 and the selection gate 40. The columnar bodies CL each include a semiconductor pillar 50 extending in the Z direction (see FIG. 2). The semiconductor pillar 50 is electrically connected to the bit line BL via contact plugs Cb and V1. It should be noted that the interlayer insulating layers provided between selection gate 40 and bit line BL are omitted in FIG. 1 for convenience in displaying a structure of the semiconductor memory device 1.

The bit line BL extends, for example, in the Y direction above the stacked bodies 100. One of the semiconductor pillars 50 provided in the stacked body 100 and one of the semiconductor pillars 50 provided in another stacked body 100 can share a bit line BL.

As shown in FIG. 2, the memory cell array MCA includes a columnar body CL extending through the word lines 20 in the Z direction. A semiconductor channel body (hereinafter referred to as a channel body 60) is provided between the columnar body CL and the source layer 10.

The source layer 10 includes, for example, a metal layer 10a and a semiconductor layer 10b. The metal layer 10a is, for example, a tungsten layer. The semiconductor layer 10b is, for example, an N-type polycrystalline silicon layer and is provided on the metal layer 10a.

The channel body 60 is provided so as to extend through the selection gate 30. In addition, the channel body 60 includes an impurity doped region 65 in a top part thereof. The impurity-doped region 65 contains, for example, N-type impurities at a higher concentration than that in other parts of the channel body 60.

The columnar body CL includes a semiconductor pillar 50, an insulating layer 70, and a core body 80. The core body 80 is, for example, an insulator including silicon oxide, and is provided with a shape of columnar extending in the Z direction. The semiconductor pillar 50 is, for example, a polycrystalline silicon layer, and extends in the Z direction so as to surround the lateral surface of the core 80. The insulating layer 70 is positioned between the semiconductor pillar 50 and the word lines 20. The insulating layer 70 has a structure, for example, in which a plurality of insulating films are stacked and acts as charge storage portions of the memory cells MC.

As shown in FIG. 2, the semiconductor pillar 50 includes a channel portion 53 and a high impurity concentration portion 55. The channel portion 53 extends through the word lines 20 in the Z-direction. The high impurity concentration portion 55 contains impurities of higher concentration than the impurity concentration in the channel portion 53. The high impurity concentration portion 55 is positioned at the bottom end of the semiconductor pillar 50, and electrically connects the semiconductor pillar 50 and the channel body 60. Further, the high impurity concentration portion 55 is positioned between the impurity-doped region 65 and the core 80 and is provided so as to be in contact with the impurity-doped region 65.

The memory cells MC are provided at portions respectively where the semiconductor pillar 50 intersects the word lines 20, and a source-side selection transistor STS is provided at a portion where the channel body 60 intersects the selection gate 30 (see FIG. 1). Further, the columnar body CL extends through the selection gate 40 (see FIG. 1). A drain side selection transistor STD is provided at a portion where the semiconductor pillar 50 intersects the selection gate 40.

The word lines 20 each include a core metal 20a and a barrier metal 20b. The selection gate 30 includes a core metal 30a and a barrier metal 30b. The core metals 20a and 30a are, for example, tungsten (W), and the barrier metals 20b and 30b are, for example, titanium nitride (TiN).

A manufacturing method of the semiconductor memory device 1 according to the first embodiment will be described below with reference to FIGS. 3A to 3J. FIGS. 3A to 3J are schematic cross-sectional views showing a manufacturing process of the semiconductor memory device 1. FIGS. 3C to 3J are schematic views of the portion corresponding to the X-Z cross section shown in FIG. 2.

Figure 3A:
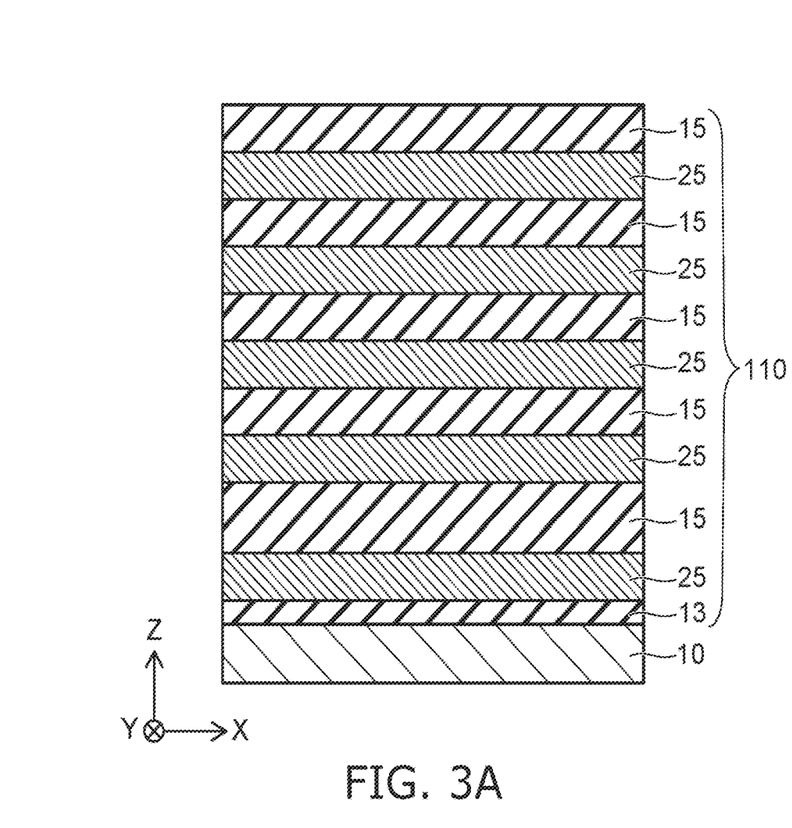
FIGS. 3A to 3J are schematic cross-sectional views showing a manufacturing process of the semiconductor memory device according to the first embodiment.

As shown in FIG. 3A, a stacked body 110 is formed on a source layer 10. The stacked body 110 includes an insulating layer 13, insulating layers 15 and 25. For example, the insulating layers 13 and 15 are silicon oxide layers and the insulating layers 25 are silicon nitride layers. The insulating layers 25 and the insulating layers 15 are alternately stacked on the insulating layer 13.

Figure 3B:
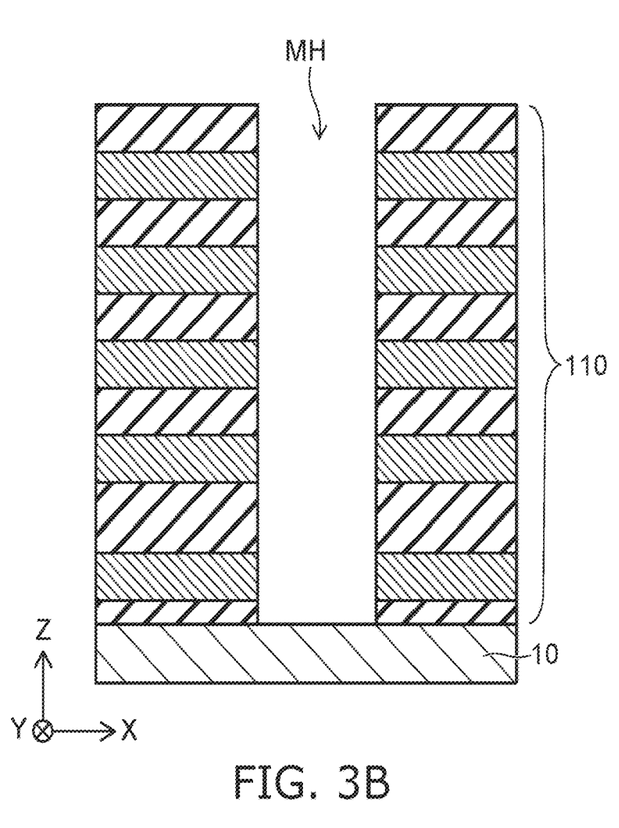

As shown in FIG. 3B, a memory hole MH is formed with a depth from the top surface of the stacked body 110 to the source layer 10. The memory hole MH is formed, for example, by selectively removing the insulating layers 13, 15 and 25 using anisotropic RIE (Reactive Ion Etching).

Figure 3C:
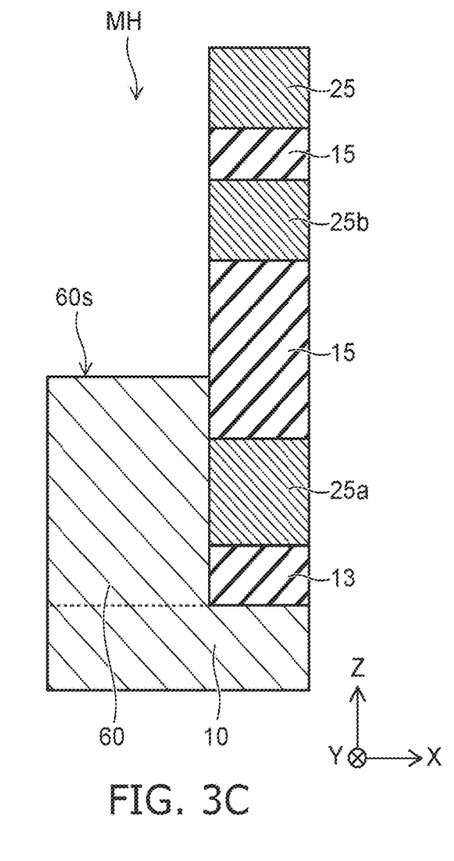

As shown in FIG. 3C, a channel body 60 is formed at the bottom of the memory hole MH. The channel body 60 is, for example, an undoped polycrystalline silicon layer deposited using CVD (Chemical Vapor Deposition). The channel body 60 is formed, for example, under conditions for achieving the selective deposition on the source layer 10.

The channel body 60 is formed such that the top surface 60s is positioned at a level between an insulating layer 25a and an insulating layer 25b. The insulating layer 25a is the lowermost insulating layer 25 of the plurality of insulating layers 25 and the insulating layer 25b is adjacent to the insulating layer 25a. Thus, the insulating layer 15 positioned between the insulating layer 25a and the insulating layer 25b is formed thicker than the other insulating layers 25.

Figure 3D:
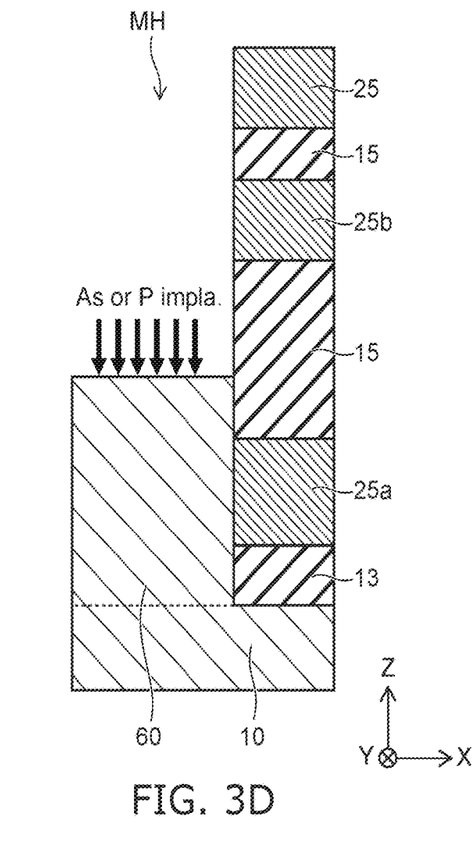

As shown in FIG. 3D, for example, phosphorus (P) or arsenic (As) which is an N-type impurity is ion-implanted into the top part of the channel body 60 through the memory hole MH.

Figure 3E:
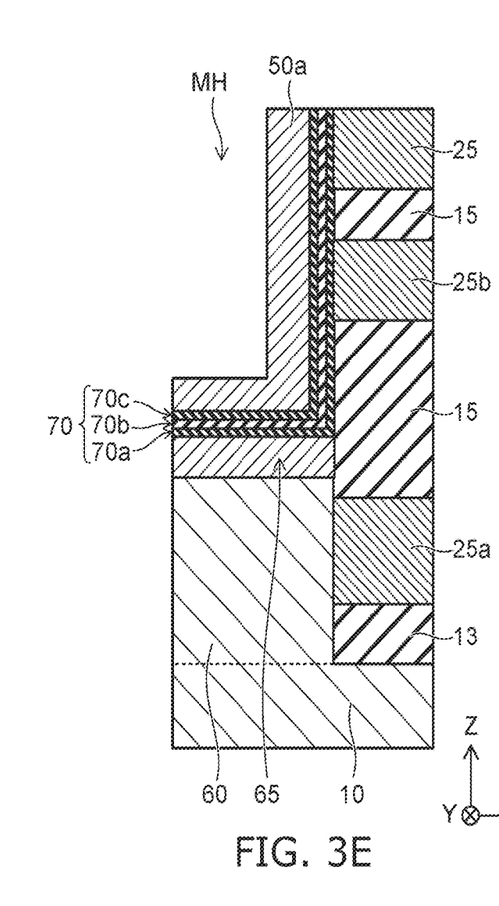

As shown in FIG. 3E, after the impurity doped region 65 is formed in the top part of the channel body 60, the insulating layer 70 and the semiconductor layer 50a are formed to cover the inner surface of the memory hole MH. The impurity-doped region 65 contains, for example, N-type impurities activated by heat treatment. The insulating layer 70 has a structure in which a first insulating film 70a, a charge storage film 70b, and a second insulating film 70c are sequentially stacked, for example, using ALD (Atomic Layer Deposition). The first insulating film 70a and the second insulating film 70c are, for example, silicon oxide films. The charge storage film 70b is, for example, a silicon nitride film. The semiconductor layer 50a is, for example, an undoped amorphous silicon layer which is deposited using CVD.

Figure 3F:
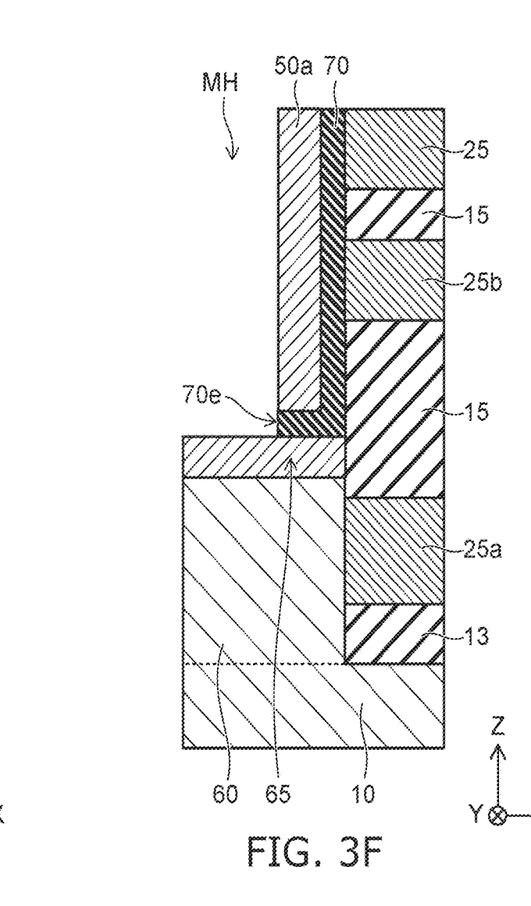

As shown in FIG. 3F, parts of the semiconductor layer 50a and the insulating layer 70 are selectively removed, which are formed on the bottom surface of the memory hole MH. The semiconductor layer 50a and the insulating layer 70 are selectively removed, for example, using anisotropic RIE so as to leave a part formed on the inner wall of the memory hole MH. Through this process, the semiconductor layer 50a protects the insulating layer 70 formed on the inner wall of the memory hole MH. After the etching, the insulating layer 70 includes the part formed on the inner wall of the memory hole and an end portion 70e positioned between the semiconductor layer 50a and the channel body 60.

Figure 3G:
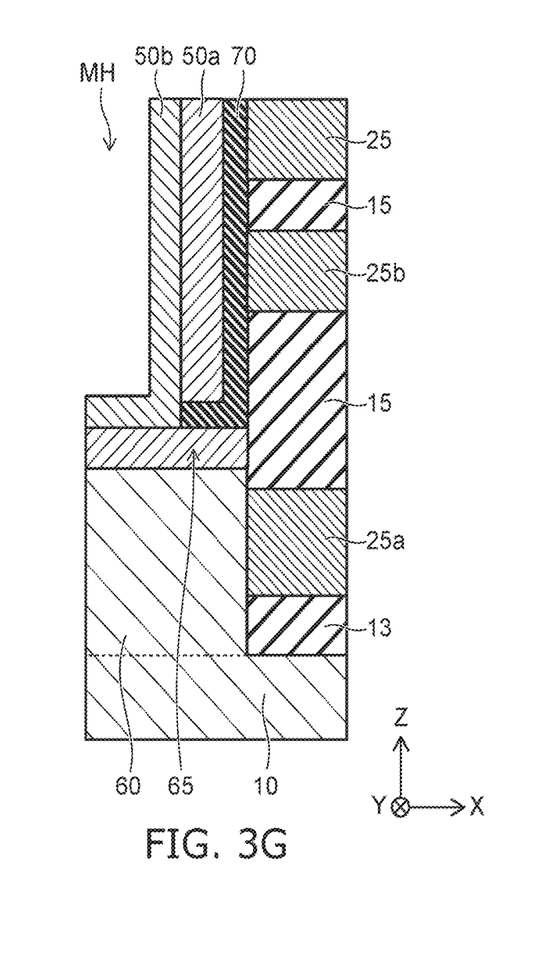

As shown in FIG. 3G, the semiconductor layer 50b is formed so as to cover the inner surface of the memory hole MH. The semiconductor layer 50b is, for example, an undoped amorphous silicon layer deposited by CVD.

Figure 3H:
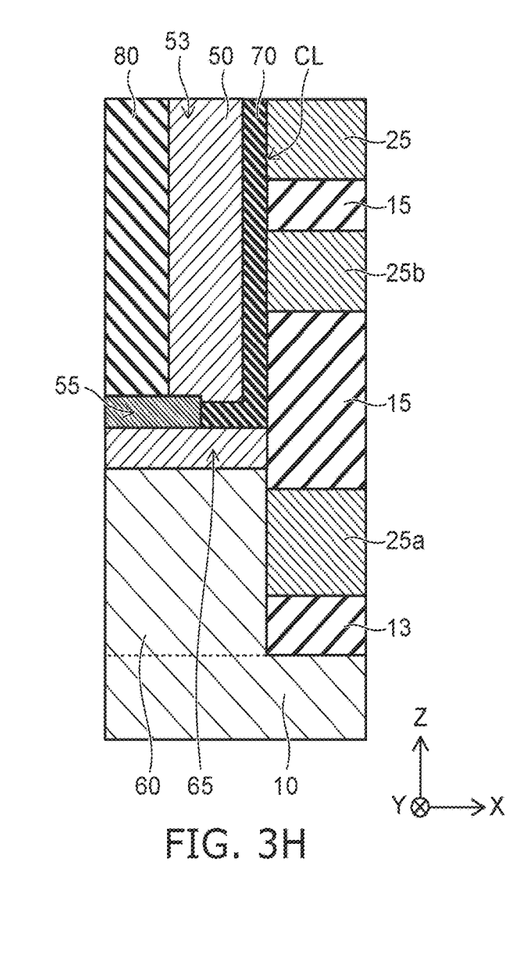

As shown in FIG. 3H, the semiconductor pillar 50 is formed by thermally treating the semiconductor layers 50a and 50b. The semiconductor pillar 50 is, for example, a poly crystalline silicon layer obtained by crystallizing the amorphous silicon contained in the semiconductor layers 50a and 50b. For example, the N-type impurities contained in the impurity-doped region 65 may diffuse into the semiconductor pillar 50 through this crystallization process, and thus, form a high impurity concentration portion 55.

The impurity diffusion into the high impurity concentration portion 55 is also facilitated in the subsequent process with thermal treatment, and it is preferable that the impurity concentration of the high impurity concentration portion 55 becomes finally not less than 5×1019 cm−3, which is higher than the density of charge traps being in the polycrystalline silicon. The impurity concentration of the channel portion 53 of the semiconductor pillar 50 is, for example, not more than 1×1019 cm−3, and the high impurity concentration portion 55 is formed with the impurity concentration higher than the impurity concentration of the channel portion 53.

Figure 3I:
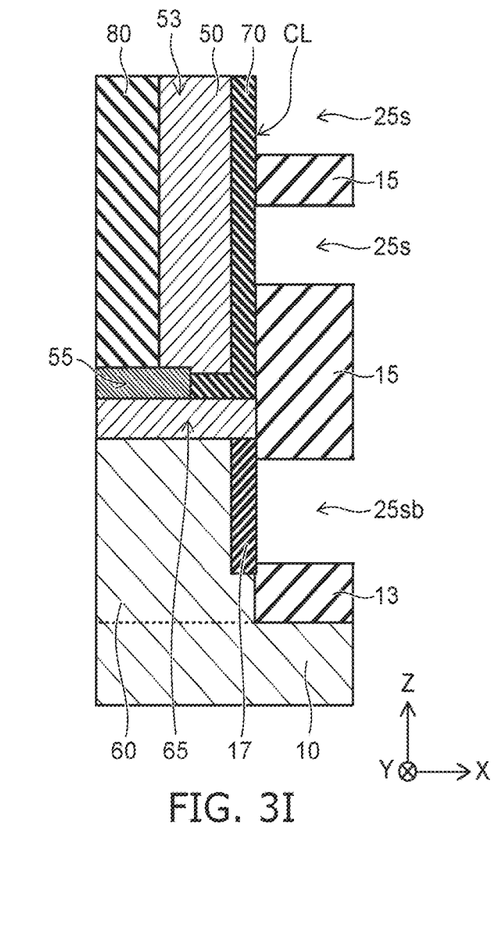

As shown in FIG. 3I, the insulating layer 25 is selectively removed to form spaces 25s and 25sb in which the lateral surfaces of the columnar body CL and the channel body 60 are exposed respectively. Thereafter, the channel body 60 is thermally oxidized through the space 25sb to form an insulating layer 17.

Figure 3J:
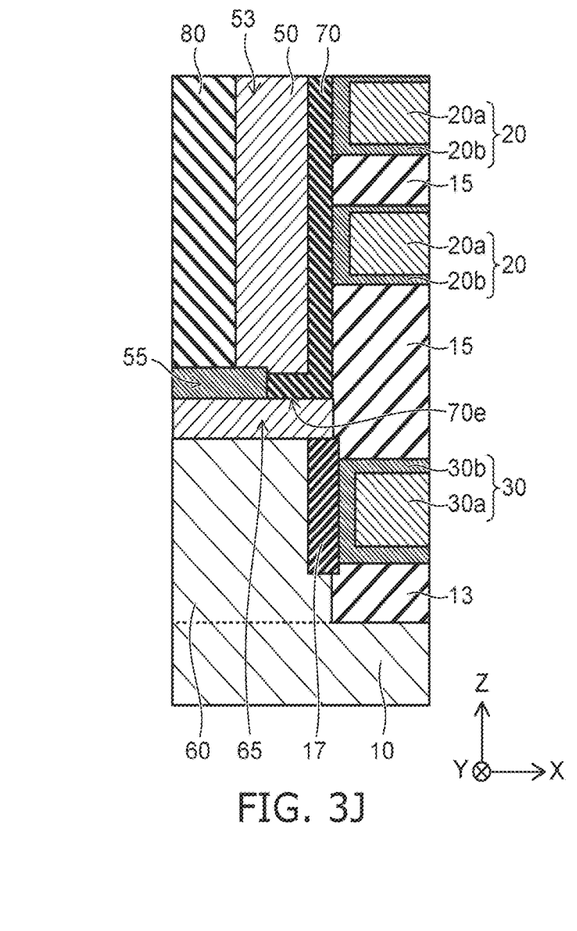

As shown in FIG. 3J, a metal layer is deposited inside the spaces 25s and 25sb, for example, using CVD to form the word lines 20 and the selection gate 30. Further, the selection gate 40 is also formed at the same time in the portion not shown to complete the memory cell array MCA.

As described above, in the manufacturing process of the semiconductor memory device 1 according to the present embodiment, the insulating layer 70 is formed so as to have an end portion 70e at the bottom end thereof. The end portion 70e extends in the center direction of the bottom end of the semiconductor pillar 50.

For example, when a bias is applied to the word line 20B, which is the lowermost layer of the plurality of word lines 20, an inversion layer is induced at the interface between the semiconductor pillar 50 and the insulating layer 70. The end portion 70e of the insulating layer 70, however, limits the downward spreading of the inversion layer, and reduces the ON-current. In contrast, it is possible in the embodiment to prevent the reduction of the ON-current by providing the high impurity concentration portion 55 that contains the impurities with higher concentration than that in the channel portion 53 of the semiconductor pillar 50.

Figure 4:
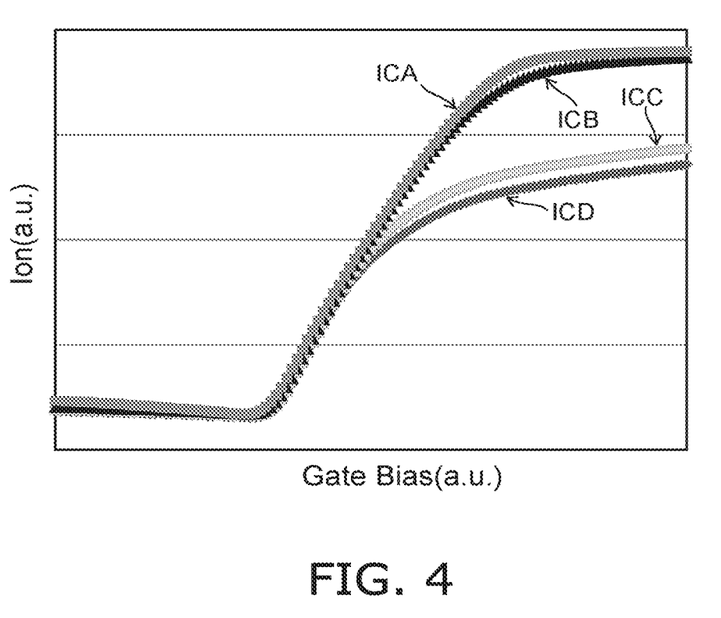
FIG. 4 is a graph showing the characteristics of the semiconductor memory device according to the first embodiment.

FIG. 4 is a graph showing the ON-current Ion with respect to the bias applied to the word line 20B. FIG. 4 shows ON-currents in four cases, in which a position of the boundary of the channel portion 53 and the high impurity concentration portion 55 is changed. The impurity concentration in the high impurity concentration portion 55, for example, decreases toward the channel portion 53, and the boundary of the channel portion 53 and the high impurity concentration portion 55 locates at a position where the impurity concentration in the high impurity concentration portion 55 is equal to the impurity concentration in the channel portion 53.

In the case of $I_{CA}$ and $I_{CB}$ shown in FIG. 4, the boundary between the channel portion 53 and the high impurity concentration portion 55 is positioned above the end portion 70e of the insulating layer 70. In the case of $I_{CC}$ and $I_{CD}$, the boundary between the channel portion 53 and the high impurity concentration portion 55 is positioned at a level lower than the top surface of the end portion 70e.

As shown in FIG. 4, the ON-currents in $I_{CA}$ and $I_{CB}$ are larger than the ON-currents in $I_{CC}$ and $I_{CD}$. That is, it is found that the boundary between the channel portion 53 and the high impurity concentration portion 55 is preferably positioned above the end portion 70e in order to prevent the ON-current from decreasing.

Figure 5A:
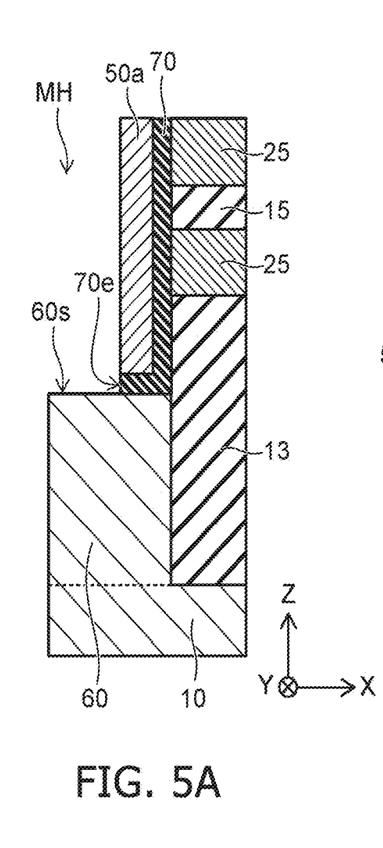
FIGS. 5A to 5C are schematic cross-sectional views showing a manufacturing process of a semiconductor memory device according to a variation of the first embodiment.
Figure 5B:
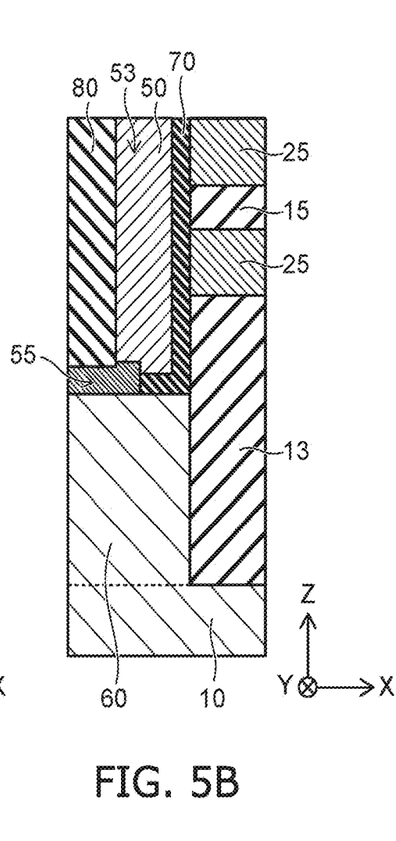
Figure 5C:
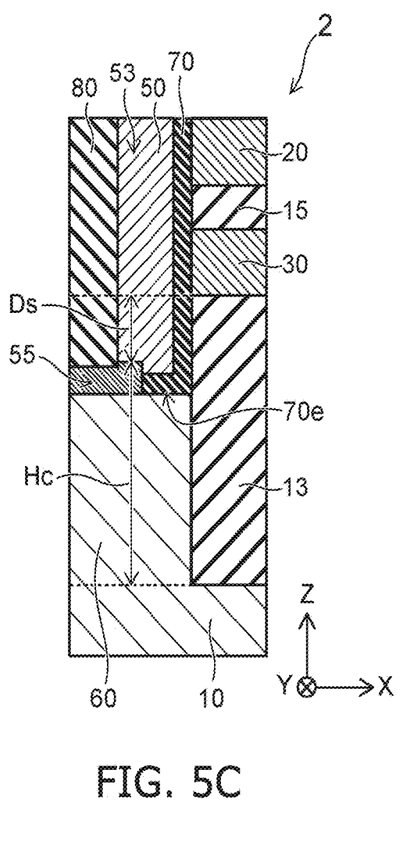

FIGS. 5A to 5C are schematic cross-sectional views showing a manufacturing process of a semiconductor memory device 2 according to a variation of the first embodiment. in the manufacturing process of the semiconductor memory device 2, as shown in FIGS. 5A and 5B, the insulating layer 25 is not disposed at a level where the channel body 60 is provided. That is, the semiconductor memory device 2 has a structure in which the channel body 60 does not intersect the selection gate 30.

FIG. 5A is a schematic view showing a step subsequent to FIG. 3E. For example, the ion implantation shown in FIG. 3D may be omitted, since the channel body 60 is doped with N-type impurities. The impurity concentration of the channel body 60 is, for example, $5 \times 10^{19}$ cm$^{-3}$.

As shown in FIG. 5A, parts of the semiconductor layer 50a and the insulating layer 70 formed on the bottom surface of the memory hole MH are selectively removed to expose the top surface 60s of the channel body 60. Thus, the end portion 70e of the insulating layer 70 is formed between the channel body 60 and the semiconductor layer 50a that remains on the inner wall of the memory hole MH.

As shown in FIG. 5B, the semiconductor pillar 50 and the core body 80 are formed in the memory hole MH (see FIGS. 3G and 3H). For example, the impurities doped in the channel body 60 are diffused by the thermal treatment while the semiconductor pillar 50 is formed, and the connecting part 55 is formed at the bottom end of the semiconductor pillar 50. The high impurity concentration portion 55 has the same conductivity type as that of the channel body 60.

As shown in FIG. 5C, the word line 20 and the selection gate 30 are formed by replacing the insulating layers 25 with metal layers. In the semiconductor memory device 2, a source side selection transistor STS is provided at a portion where the semiconductor pillar 50 intersects the selection gate 30. The impurity concentration of the high impurity concentration portion 55 is, for example, about $5 \times 10^{19}$ cm$^{-3}$ which is approximately the same as that of the channel body 60.

Figure 6A:
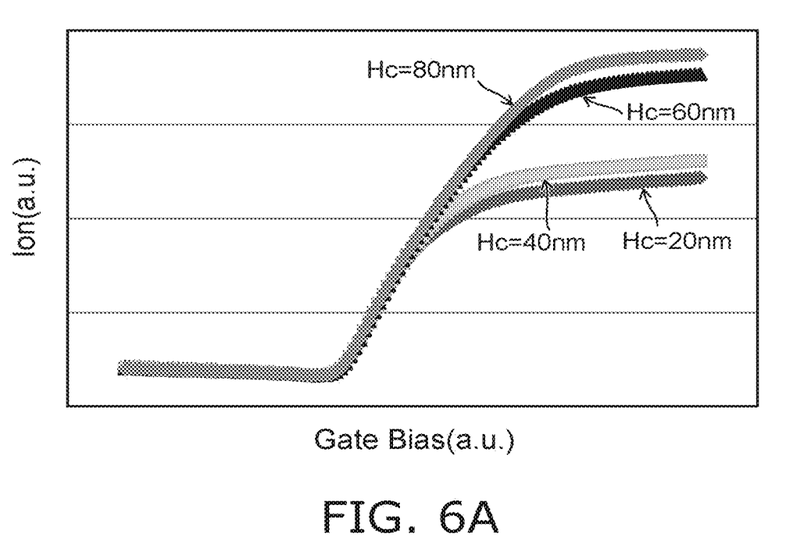
FIGS. 6A and 6B are graphs showing the characteristics of the semiconductor memory device according to the variation of the first embodiment.

FIG. 6A is a graph showing ON-currents Ion with respect to the bias applied to the selection gate 30. FIG. 6A shows the ON currents in four cases where the distance Hc (see FIG. 5C) between the source layer 10 and the boundary of the channel portion 53 and the high impurity concentration portion 55 is changed.

As shown in FIG. 6A, the ON-currents Ion in the case of Hc=60 nm and 80 nm is larger than in the case of Hc=20 nm and 40 nm. In the case of Hc=60 nm and 80 nm, the boundary of the channel part 53 and the connection part 55 is positioned above the end portion 70e of the insulating layer 70.

In contrast, in the case of Hc=20 nm and 40 nm, the boundary of the channel portion 53 and the high impurity concentration portion 55 is positioned at a level lower than the top surface of the end portion 70e. That is, it is also found in this example that the reduction of the ON-current Ion can be avoided by positioning the boundary of the channel portion 53 and the high impurity concentration portion 55 above the end portion 70e.

Figure 6B:
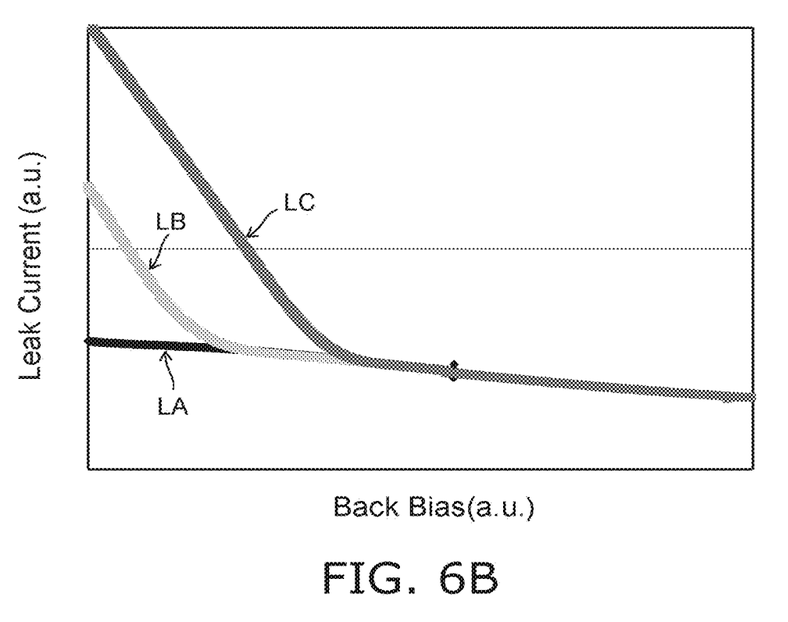

FIG. 6B is a graph showing another characteristics of the semiconductor memory device 2. FIG. 6B is a graph showing the leakage currents of the selection transistor STS with respect to the back bias when boosting the channel potential of the memory cells MC. When boosting, for example, the selection transistors STS and STD are turned off, and Vpass is applied to the word line 20.

FIG. 6B shows three cases in which the distance Ds (see FIG. 5C) is changed between the boundary of the channel portion 53 and the high impurity concentration portion 55 and the portion where the semiconductor pillar 50 intersects the selection gate 30. LA, LB and LC show cases where Ds=100 nanometers (nm), Ds=60 nm, and Ds=20 nm respectively.

The leakage current of the selection transistor STS increases as the back bias is lowered. As shown in FIG. 6B, the leakage current increases as Ds become shorter. That is, it is possible to suppress the leakage current at lower level as Ds become longer. However, the ON-current is reduced as Ds become longer. Thus, it is preferable to set, for example, Ds>60 nm to avoid the reduction of ON-current when reading data out, and to reduce the leakage current when boosting.

Second Embodiment

Figure 7A:
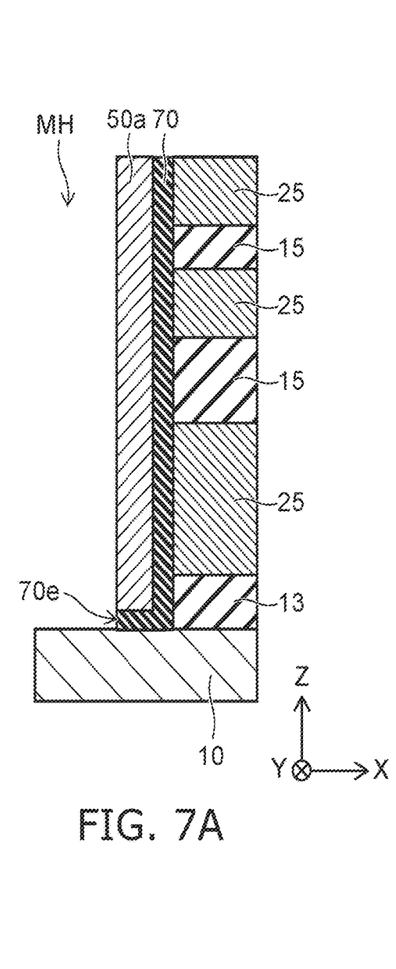
FIGS. 7A to 7C are schematic cross-sectional views showing a manufacturing process of a semiconductor memory device according to another variation of the first embodiment.
Figure 7B:
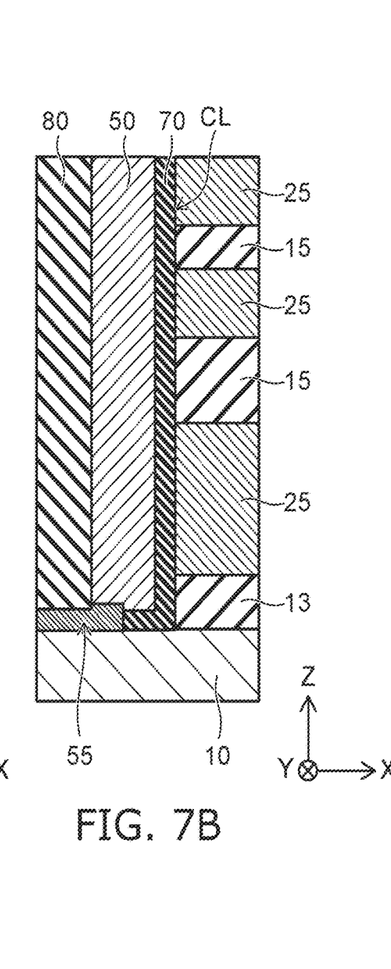
Figure 7C:
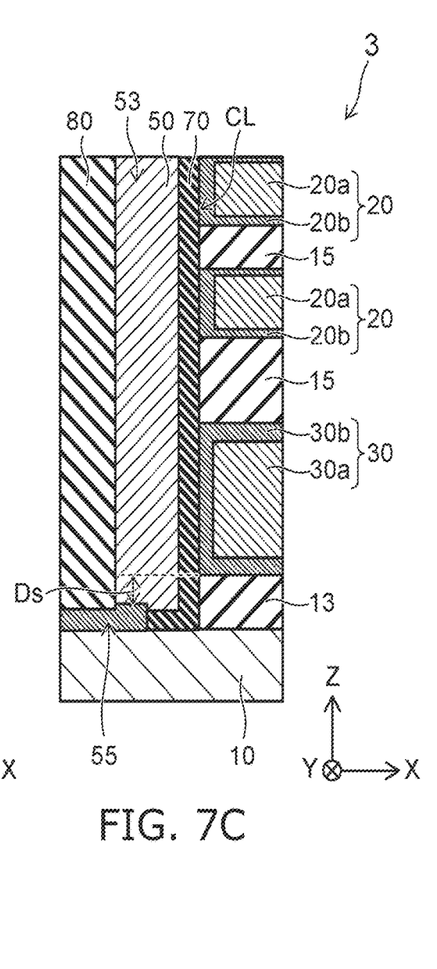

FIGS. 7A to 7C are schematic cross-sectional views showing a manufacturing process of a semiconductor memory device 3 according to the second embodiment. As shown in FIG. 7C, the channel body 60 is not provided in the semiconductor memory device 3, and the semiconductor pillar 50 is connected to the source layer 10.

As shown in FIG. 7A, the end portion 70e of the insulating layer 70 is formed so as to be in contact with the source layer 10. The source layer 10 is, for example, doped with N-type impurities. Furthermore, before forming the semiconductor layer 50a and the insulating layer 70, the impurities may be implanted through the memory hole MH to form an impurity doped region on the front surface side of the source layer 10. For example, phosphorus (P) that has a diffusion coefficient larger than that of arsenic (As) may be implanted into the N-type semiconductor layer containing arsenic and be diffused from the source layer 10 to the bottom end of the semiconductor pillar 50.

As shown in FIG. 7B, the semiconductor pillar 50 and the core body 80 are formed in the memory hole MH (see FIGS. 3G and 3H). For example, the impurities doped in the source layer 10 are diffused by a thermal treatment while the semiconductor pillar 50 is formed, and the high impurity concentration portion 55 is formed at the bottom end of the semiconductor pillar 50.

As shown in FIG. 7C, the word lines 20 and the selection gate 30 are formed by replacing the insulating layers 25 with metal layers. The semiconductor memory device 3 includes a source side selection transistor STS provided at a portion where the semiconductor pillar 50 intersects the selection gate 30. Also in the semiconductor memory device 3, in order to prevent the reduction of the ON-current, the high impurity concentration portion 55 is formed so that the boundary of the channel portion 53 and the high impurity concentration portion 55 in the semiconductor pillar 50 is positioned above the end portion 70e of the insulating layer 70. Moreover, the distance Ds is preferably 60 nm or more between the high impurity concentration portion 55 and the portion where the semiconductor pillar 50 intersects the selection gate 30.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
a conductive layer;
a plurality of electrode layers stacked on the conductive layer;
a semiconductor pillar extending through the plurality of electrode layers in a stacking direction and electrically connected to the conductive layer;
an insulating layer positioned between the semiconductor pillar and the plurality of electrode layers, the insulating layer extending along the semiconductor pillar in the stacking direction, wherein
the semiconductor pillar has a channel portion extending through the plurality of electrode layers and a high impurity concentration portion positioned at a bottom end on a side of the conductive layer, the high impurity concentration portion including an impurity of a higher concentration than an impurity concentration in the channel portion,
the insulating layer has an end portion extending toward a center of the bottom end of the semiconductor pillar, and
a boundary of the channel portion and the high impurity concentration portion is positioned above the end portion of the insulating layer; and
a semiconductor channel body provided between the conductive layer and the semiconductor pillar and having a conductive type same as a conductive type of the high impurity concentration portion.

2. The semiconductor memory device according to claim 1, wherein the high impurity concentration portion includes an impurity element same as an impurity element in the semiconductor channel body.

3. The semiconductor memory device according to claim 1, further comprising:
an other electrode layer positioned between the conductive layer and an electrode layer located at an end of the plurality of electrode layers on a side of the conductive layer,
wherein the semiconductor channel body extends through the other electrode layer in the stacking direction.

4. The semiconductor memory device according to claim 1, wherein
the semiconductor channel body has a top end containing an impurity element same as a main impurity element in the high impurity concentration portion, and
the top end includes the impurity element with a higher concentration than an impurity concentration in other portion of the semiconductor channel body.

5. The semiconductor memory device according to claim 1, wherein
the insulating layer has a stacked structure, the stacked structure including:
a charge storage film positioned between the semiconductor pillar and the plurality of electrode layers, the charge storage film extending along the semiconductor pillar in the stacking direction,
a first insulating film positioned between the charge storage film and the plurality of electrode layers, the first insulating film extending in the stacking direction along the charge storage film, and
a second insulating film positioned between the semiconductor pillar and the charge storage layer, the second insulating film extending along the semiconductor pillar in the stacking direction.

6. The semiconductor memory device according to claim 1, wherein
the semiconductor pillar has a polycrystalline structure, and
the impurity concentration of the high impurity concentration portion is higher than a charge trap density in the semiconductor pillar.

7. The semiconductor memory device according to claim 1, wherein the conductive layer includes a semiconductor layer having a conductivity type same as a conductivity type of the high impurity concentration portion.

8. The semiconductor memory device according to claim 7, wherein
the conductive layer includes the semiconductor layer and a metal layer, and
the semiconductor layer is positioned between the high impurity concentration portion and the metal layer.

9. The semiconductor memory device according to claim 1, wherein the impurity concentration of the high impurity concentration portion is not less than $5\times10^{19}$ cm$^{-3}$.

10. The semiconductor memory device according to claim 9, wherein the impurity concentration of the channel portion is not more than $1\times10^{19}$ cm$^{-3}$.

11. A semiconductor memory device comprising:
a conductive layer;
a plurality of electrode layers stacked on the conductive layer;
a semiconductor pillar extending through the plurality of electrode layers in a stacking direction and electrically connected to the conductive layer; and
an insulating layer positioned between the semiconductor pillar and the plurality of electrode layers, the insulating layer extending along the semiconductor pillar in the stacking direction, wherein
the semiconductor pillar has a channel portion extending through the plurality of electrode layers and a high impurity concentration portion positioned at a bottom end on a side of the conductive layer, the high impurity concentration portion including an impurity of a higher concentration than an impurity concentration in the channel portion,
the insulating layer has an end portion extending toward a center of the bottom end of the semiconductor pillar,
a boundary of the channel portion and the high impurity concentration portion is positioned above the end portion of the insulating layer, and
the impurity concentration of the high impurity concentration portion is not less than $5\times10^{19}$ cm$^{-3}$.

12. The semiconductor memory device according to claim 11, wherein the impurity concentration of the channel portion is not more than $1\times10^{19}$ cm$^{-3}$.

13. A semiconductor memory device comprising:
a conductive layer;
a plurality of electrode layers stacked on the conductive layer;
a semiconductor pillar extending through the plurality of electrode layers in a stacking direction and electrically connected to the conductive layer;
an insulating layer positioned between the semiconductor pillar and the plurality of electrode layers, the insulating layer extending along the semiconductor pillar in the stacking direction;
an other electrode layer positioned between the conductive layer and an electrode layer located at an end of the plurality of electrode layers on a side of the conductive layer; and
a semiconductor channel body provided between the conductive layer and the semiconductor pillar and extending through the other electrode layer in the stacking direction, wherein
the semiconductor pillar has a channel portion extending through the plurality of electrode layers and a high impurity concentration portion positioned at a bottom end on a side of the conductive layer, the high impurity concentration portion including an impurity of a higher concentration than an impurity concentration in the channel portion,
the insulating layer has an end portion extending toward a center of the bottom end of the semiconductor pillar, and
a boundary of the channel portion and the high impurity concentration portion is positioned above the end portion of the insulating layer.

14. The semiconductor memory device according to claim 13, wherein the high impurity concentration portion includes an impurity element same as an impurity element in the semiconductor channel body.

* * * * *